(12) United States Patent
Blish, II et al.

(10) Patent No.: US 8,384,210 B1
(45) Date of Patent: Feb. 26, 2013

(54) THERMAL INTERFACE MATERIAL AND SEMICONDUCTOR COMPONENT INCLUDING THE THERMAL INTERFACE MATERIAL

(75) Inventors: Richard C. Blish, II, Saratoga, CA (US); James L. Hayward, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1880 days.

(21) Appl. No.: 11/147,598

(22) Filed: Jun. 7, 2005

(51) Int. Cl.
*H01L 23/34* (2006.01)

(52) U.S. Cl. .................. 257/706; 257/707; 257/E23.08; 438/584

(58) Field of Classification Search .................. 257/706, 257/707, E23.08; 438/584
See application file for complete search history.

(56) References Cited

U.S. PATENT DOCUMENTS

| | | | | |
|---|---|---|---|---|
| 3,610,859 | A * | 10/1971 | Schreiner et al. | 200/264 |
| 4,785,137 | A * | 11/1988 | Samuels | 174/559 |
| 4,998,239 | A * | 3/1991 | Strandjord et al. | 369/275.1 |
| 5,056,706 | A | 10/1991 | Dolbear et al. | |
| 5,170,930 | A | 12/1992 | Dolbear et al. | |
| 6,791,839 | B2 | 9/2004 | Bhagwagar | |
| 6,797,382 | B2 | 9/2004 | Nguyen et al. | |
| 6,947,285 | B2 * | 9/2005 | Chen et al. | 361/708 |
| 7,030,483 | B2 * | 4/2006 | Matayabas et al. | 257/706 |
| 7,147,367 | B2 * | 12/2006 | Balian et al. | 374/44 |
| 2003/0173051 | A1 * | 9/2003 | Rinella et al. | 164/113 |
| 2004/0074952 | A1 * | 4/2004 | Stipp et al. | 228/245 |
| 2004/0188503 | A1 | 9/2004 | Hua | |
| 2005/0016714 | A1 * | 1/2005 | Chung | 165/104.15 |
| 2005/0245060 | A1 * | 11/2005 | Chiu | 438/612 |
| 2005/0256241 | A1 * | 11/2005 | Sachdev et al. | 524/439 |

OTHER PUBLICATIONS

Wang, Q. et al. "Electrical Resistivity of Molten Indium-Antimony Alloys." Journal of Applied Physics, vol. 87, No. 9, pp. 4623-4625. May 1, 2000.*

* cited by examiner

*Primary Examiner* — Tom Thomas
*Assistant Examiner* — Christopher M Roland
(74) *Attorney, Agent, or Firm* — Farjami & Farjami LLP

(57) ABSTRACT

A thermal interface material for use in manufacturing a semiconductor component and a method for manufacturing the semiconductor component. The thermal interface material includes a metallic element in combination with either antimony or tin. Suitable metallic elements include gallium or indium. The concentration of antimony or tin is about 2 percent or less by weight of the thermal interface material. A semiconductor chip is mounted to a support substrate and the thermal interface material is disposed on the semiconductor chip. A lid or a heatsink is coupled to the semiconductor chip via the thermal interface material.

9 Claims, 1 Drawing Sheet

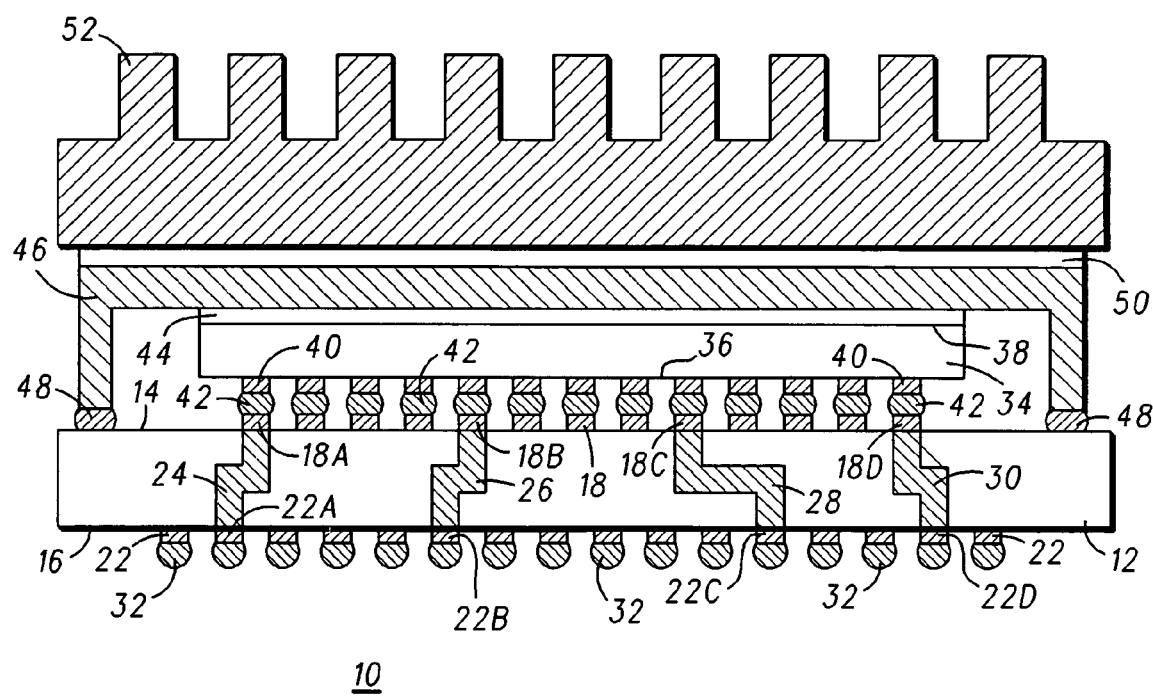

THERMAL INTERFACE MATERIAL AND SEMICONDUCTOR COMPONENT INCLUDING THE THERMAL INTERFACE MATERIAL

FIELD OF THE INVENTION

The present invention relates, in general, to semiconductor component manufacture and, more particularly, to thermal interface materials used in semiconductor component manufacture.

BACKGROUND OF THE INVENTION

Semiconductor component manufacturers are constantly striving to lower their manufacturing costs by increasing the number of semiconductor devices that can be manufactured from a single wafer, i.e., increasing the device density. Because high density integrated circuits generate large amounts of heat, an important concern in their design and manufacture is heat removal. One reason for concern is that the additional heat slows down the semiconductor devices. Another reason for concern is that if sufficient amounts of heat are not removed, the semiconductor devices making up the integrated circuit may become damaged or destroyed during operation.

As part of the manufacturing process, semiconductor component manufacturers saw or slice the semiconductor wafers into portions called semiconductor chips. Then, they typically enclose the semiconductor chips within a protective package to protect them from physical and environmental stresses. These packages may have a large thermal impedance that inhibits transport of heat (commonly called heat dissipation) away from the semiconductor chips or they may trap heat near the integrated circuits, thereby increasing the probability of integrated circuit failure. One technique for increasing the amount of heat transferred away from a semiconductor chip has been to form a thermal interface material on the semiconductor chip and contact the thermal interface material with a structure capable of conducting a large amount of heat such as, for example, a lid or a heatsink. The lid spreads the heat from a concentrated source in the semiconductor chip to a larger area more suitable for heat transport. A heatsink has a large area from which to dissipate heat and oftentimes is used in conjunction with a fan. The thermal interface material facilitates transfer of heat away from the semiconductor chip to the lid or the heatsink. A drawback with thermal interface materials is that their constituent components could become oxidized which increases the thermal impedance of the thermal interface material and decreases the amount of heat conducted by the thermal interface material. For example, in a thermal interface material comprising an open-cell polymer filled with liquid gallium, the gallium droplets have a large surface area relative to their volume, which increases the amount of gallium that can be converted to gallium oxide. Because gallium oxide has a high thermal impedance relative to the unoxidized gallium metal, it inhibits the transfer of heat away from the semiconductor chip and increases the probability of catastrophic device failure. Similarly, indium is also susceptible to oxidation when used in a thermal interface material.

Accordingly, it would be advantageous to have a thermal interface material suitable for use in the manufacture of integrated circuits that inhibits oxide formation. It would be of further advantage to have a semiconductor component and a method for manufacturing the semiconductor component that includes using the thermal interface material.

SUMMARY OF THE INVENTION

The present invention satisfies the foregoing need by providing a thermal interface material for use in manufacturing a semiconductor component, a semiconductor component that includes the thermal interface material, and a method for manufacturing the semiconductor component. In accordance with one embodiment, the present invention comprises a thermal interface material, consisting essentially of a fusible metal to which is added either antimony or tin, wherein the concentration of antimony or tin is about 2 percent or less by weight of the thermal interface material.

In accordance with another embodiment, the present invention includes a thermal interface material that consists essentially of two metals. The first metal is selected from the group of metals consisting of gallium and indium and the second metal is selected from the group of metals consisting of antimony and tin. A concentration of the second metal is about 2 percent or less by weight of the thermal interface material.

In accordance with yet another embodiment, the present invention comprises a method for manufacturing a semiconductor component that includes providing a support substrate having a semiconductor chip mounted to a chip receiving area of the support substrate. A thermal interface material is disposed over the semiconductor chip, wherein the thermal interface material consists essentially of a metallic element and either antimony or tin in which the concentration of antimony or tin is about 2 percent or less by weight. The metallic element may be gallium or indium.

In accordance with yet another embodiment, the present invention comprises a semiconductor component that includes a support substrate having a chip receiving area and a semiconductor chip mounted to the chip receiving area. A thermal interface material is disposed over the semiconductor chip, wherein the thermal interface material consists essentially of a metallic element and either antimony or tin in a concentration of about 2 percent or less by weight. The metallic element may be gallium or indium.

BRIEF DESCRIPTION OF THE DRAWINGS

The present invention will be better understood from a reading of the following detailed description, taken in conjunction with the accompanying drawing FIGURE which is a cross-sectional side view of a semiconductor component in accordance with an embodiment of the present invention.

DETAILED DESCRIPTION

The single FIGURE is a cross-sectional side view of a portion of a semiconductor component 10 during manufacture in accordance with an embodiment of the present invention. What is shown in the single FIGURE is a Ball Grid Array (BGA) support structure 12 having top and bottom surfaces 14 and 16, respectively. BGA support substrate 12 is formed from a resin such as an epoxy resin, a polyimide resin, a triazine resin, or a phenolic resin. Preferably, the resin material of BGA support substrate 12 is bismaleimidetriazine (BT) resin. Other suitable materials for support substrate 12 include epoxy-glass composites, FR-4, ceramics, and the like. It should be understood that substrate 12 is not limited to being a BGA substrate but may also be a Pin Grid Array (PGA) substrate, a ceramic substrate, a printed circuit board, or the like. A plurality of bonding pads 18 are formed on top surface 14 and a plurality of bonding pads 22 are formed on bottom surface 16. Bonding pads 18A, 18B, 18C, and 18D are four bonding pads from the plurality of bonding pads 18 and bonding pads 22A, 22B, 22C, and 22D are four bonding pads from the plurality of bonding pads 22. Bonding pads 18A, 18B, 18C, and 18D are electrically connected to bonding pads 22A, 22B, 22C, and 22D, respectively, on bottom surface 16 through electrical interconnects 24, 26, 28, and 30 that extend through BGA support substrate 12. Bonding pads 18A, 18B, 18C, and 18D are four bonding pads from the plurality of bonding pads 18 and bonding pads 22A, 22B, 22C, and 22D are four bonding pads from the plurality of bonding pads 22. For the sake of clarity, only four interconnects are shown as extending through BGA support substrate 12 in the single FIGURE. However, it should be understood that all, or nearly all, of the bonding pads on the top surface of a support substrate such as support substrate 12 are coupled to bonding pads on the bottom surface of the support substrate. Solder balls 32 are attached to bonding pads 22.

A semiconductor chip 34 having a front or active surface 36 and a back or mounting surface 38 is flip-chip mounted to support substrate 12. More particularly, a plurality bonding pads 40 disposed on active surface 36 are coupled to corresponding bonding pads 18 via solder balls 42.

A thermal interface material 44 is disposed on back surface 38. Thermal interface material 44 comprises a fusible metal to which antimony or tin is added, wherein the concentration of antimony or tin is about 2 percent or less by weight of thermal interface material 44. The fusible metal is also referred to as a metallic element. In accordance with one embodiment thermal interface material 44 comprises indium and antimony, i.e., the metallic element is indium. Preferably, the concentration of antimony ranges from about 0.2 percent by weight to about 0.7 percent by weight of thermal interface material 44. More preferably, the concentration of antimony is about 0.7 percent by weight of thermal interface 44 and even more preferably the concentration of antimony is about 0.2 percent by weight of thermal interface material 44. Alternatively, the concentration of antimony ranges from about 0.7 percent by weight of thermal interface material 44 to about 2 percent by weight of thermal interface material 44.

In accordance with another embodiment thermal interface material 44 comprises indium and tin, i.e., the metallic element is indium. Preferably, the concentration of tin ranges from about 0.2 percent by weight to about 0.7 percent by weight of thermal interface material 44. More preferably, the concentration of tin is about 0.7 percent by weight of thermal interface 44 and even more preferably the concentration of tin is about 0.2 percent by weight of thermal interface material 44. Alternatively, the concentration of tin ranges from about 0.7 percent by weight of thermal interface material 44 to about 2 percent by weight of thermal interface material 44.

In accordance with another embodiment thermal interface material 44 comprises gallium and antimony, i.e., the metallic element is gallium. Preferably, the concentration of antimony ranges from about 0.2 percent by weight to about 0.7 percent by weight of thermal interface material 44. More preferably, the concentration of antimony is about 0.7 percent by weight of thermal interface 44 and even more preferably the concentration of antimony is about 0.2 percent by weight of thermal interface material 44. Alternatively, the concentration of antimony ranges from about 0.7 percent by weight of thermal interface material 44 to about 2 percent by weight of thermal interface material 44.

In accordance with another embodiment thermal interface material 44 comprises gallium and tin, i.e., the metallic element is gallium. Preferably, the concentration of tin ranges from about 0.2 percent by weight to about 0.7 percent by weight of thermal interface material 44. More preferably, the concentration of tin is about 0.7 percent by weight of thermal interface 44 and even more preferably the concentration of tin is about 0.2 percent by weight of thermal interface material 44. Alternatively, the concentration of tin ranges from about 0.7 percent by weight of thermal interface material 44 to about 2 percent by weight of thermal interface material 44.

A protective covering 46 is formed over semiconductor chip 34. Preferably, protective covering 46 is a lid secured to BGA support substrate 12 by a lid attach material 48. However, it should be understood that the type of protective covering is not limited to being a lid. For example, protective covering 46 may be a glob top material or other suitable protective material.

A thermal grease 50 is disposed on protective covering 46 and a heatsink 52 is mounted in thermal grease 50. As those skilled in the art are aware, thermal grease increases the thermal impedance between two thermally conductive media such as protective covering 46 and heatsink 52. It should be understood that heatsink 52 is optional and that protective covering 46 may provide sufficient heat transfer from semiconductor chip 34.

By now it should be appreciated that a thermal interface material, a semiconductor component, and a method for manufacturing the semiconductor component using the thermal interface material have been provided. In accordance with one aspect, the thermal interface material comprises a metallic element in combination with antimony or tin. An advantage of including antimony or tin at a concentration of about 2 percent or less by weight is that oxygen should preferentially react with antimony or tin rather than the metallic element, thereby inhibiting oxide formation and the resulting increase in the thermal impedance. In other words, the antimony or tin keeps the thermal interface material in a low thermal impedance state, i.e., a high thermally conductive state. In addition, keeping the antimony or tin concentration at 2 percent or less ensures that the component with the greater affinity for oxygen segregates at the surface, thereby offering protection against oxidation of the fusible metal, i.e., indium or gallium. What's more, the low concentration of antimony or tin does not appreciably degrade the thermal conductivity of the thermal interface material.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:
1. A thermal interface material, consisting essentially of:
a fusible metal; and
antimony added to said fusible metal, wherein a concentration of the antimony is about 2 percent or less by weight of the thermal interface material.
2. The thermal interface material of claim 1, wherein the fusible metal is indium.
3. The thermal interface material of claim 1, wherein the fusible metal is indium and the antimony is at a concentration of about 0.2 percent by weight of the thermal interface material.

4. The thermal interface material of claim 1, wherein the fusible metal is indium and the antimony is at a concentration of about 0.7 percent by weight of the thermal interface material.

5. The thermal interface material of claim 1, wherein the fusible metal is indium and the antimony is at a concentration ranging from about 0.2 percent by weight of the thermal interface material to about 0.7 percent by weight of the thermal interface material.

6. A thermal interface material, consisting essentially of:
   indium; and
   a second metal consisting of antimony added to said indium, wherein a concentration of the second metal is about 2 percent or less by weight of the thermal interface material.

7. The thermal interface material of claim 6, wherein the concentration of the second metal ranges from about 0.2 percent by weight of the thermal interface material to about 0.7 percent by weight of the thermal interface material.

8. A semiconductor component, comprising:
   a support substrate having a chip receiving area;
   a semiconductor chip mounted to the chip receiving area; and
   a thermal interface material disposed over the semiconductor chip, the thermal interface material consisting essentially of a metallic element and antimony added to said metallic element, wherein a concentration of the antimony is about 2 percent or less by weight of the thermal interface material, and wherein the metallic element comprises indium.

9. The semiconductor component of claim 8, wherein the concentration of the antimony ranges from about 0.2 percent by weight of the thermal interface material to about 0.7 percent by weight of the thermal interface material.

* * * * *